(12) United States Patent
Sumi et al.

(10) Patent No.: US 6,748,635 B1
(45) Date of Patent: Jun. 15, 2004

(54) METHOD OF MANUFACTURING PIEZOELECTRIC THIN FILM COMPONENT

(75) Inventors: Kouji Sumi, Nagano (JP); Qiu Hong, Nagano (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/665,314

(22) Filed: Sep. 19, 2000

Related U.S. Application Data

(62) Division of application No. 09/236,110, filed on Jan. 25, 1999, now Pat. No. 6,194,818.

(30) Foreign Application Priority Data

Jan. 23, 1998 (JP) .............................................. 10-11405

(51) Int. Cl.$^7$ ......................... H04R 17/00; H05K 3/10; B05D 3/02
(52) U.S. Cl. ........................ 29/25.35; 29/846; 427/100; 427/226; 427/419.8; 252/62.9 PZ
(58) Field of Search ............................ 29/25.35, 890.1, 29/846; 427/100, 226, 419.8, 227; 310/800; 252/62.9 PZ; 156/89.12, 89.16

(56) References Cited

U.S. PATENT DOCUMENTS

| | | | | |
|---|---|---|---|---|
| 4,668,531 A | * | 5/1987 | Asano et al. | 427/226 |
| 4,963,390 A | * | 10/1990 | Lipeles et al. | 427/100 |
| 5,116,643 A | * | 5/1992 | Miller et al. | 427/100 |
| 5,130,103 A | | 7/1992 | Yamagata et al. | |
| 5,198,269 A | * | 3/1993 | Swartz et al. | 427/226 |
| 5,320,907 A | | 6/1994 | Sato | |
| 5,644,838 A | * | 7/1997 | Beratan | 29/25.35 |
| 5,650,362 A | * | 7/1997 | Nashimoto | 427/100 |
| 6,001,416 A | | 12/1999 | Moriyama et al. | |
| 6,056,994 A | * | 5/2000 | Paz de Araujo et al. | 427/226 |
| 6,066,581 A | * | 5/2000 | Chivukula et al. | 252/62.9 PZ |
| 6,174,564 B1 | * | 1/2001 | Scott et al. | 427/226 |
| 6,194,227 B1 | * | 2/2001 | Hase | 427/100 |

FOREIGN PATENT DOCUMENTS

| | | | |
|---|---|---|---|
| EP | 0 932 209 | 7/1999 | |
| JP | 2-281769 | * 11/1990 | 29/25.35 |
| JP | 6-40035 | 2/1994 | |

OTHER PUBLICATIONS

Chung et al, Electrode Stress Effects on Electrical Properties of PZT Thin Film Capacitors, Applications of Ferroelectrics, ISAF 1994., Proceedings of the Ninth IEEE International Symposium, pp. 527–530, Aug. 1994.* Yamaguchi et al, Ultrasonic Properties of PZT Thin Films in UHF–SHF ranges–prepared Sol Gel Method, Frequency Control Symposium, 1997., Proceedings of the 1997 IEEE International, pp. 544–551, May 1997.* Klee, M., et al., "Analytical Study of the Growth of Polycrystalline Titanate Thin Films," Philips Journal of Research vol. 47, Nos. 3–5:263–285 (1993). Kumar et al., "Lead Zirconate Titanate Films by Rapid Thermal Processing," Appl. Phys. Lett. 58 (11), Mar. 18, 1991, pp. 1161–1163. Reaney et al., "Use of Transmission Electron Microscopy for the Characterization of Rapid Thermally Annealed, Solution–Gel Lead Zirconate Titanate Films," Journal of the American Ceramic Society, vol. 77, No. 5, pp. 1209–1216 (1994). Gary S. Snow, Fabrication of Transparent Electrooptic PLZT Ceramics by Atmosphere Sintering, 56 Journal of the American Ceramic Society, pp. 91–96 (1973).

* cited by examiner

*Primary Examiner*—A. Dexter Tugbang
(74) *Attorney, Agent, or Firm*—Sterne, Kessler, Goldstein & Fox P.L.L.C.

(57) ABSTRACT

A method of manufacturing a piezoelectric thin film component utilizing seed crystals, such as crystals of titanium, as a crystal source on a bottom electrode. Crystals of piezoelectric material are grown using the seed crystals as a nucleus, wherein a crystal grain size and orientation of the piezoelectric material formed on the crystal source may be of a different orientation and crystal grain size from that of the bottom electrode. The piezoelectric thin film formed by this operation is of a polycrystalline structure. The formation of the piezoelectric thin film by this method includes a sol-gel film formation process utilizing a sol composition having an high molecular organic compound which creates a porous gel thin film. Further, the formation of the piezoelectric thin film by this method may include a metal organic decomposition process utilizing a hydrolysis inhibitor in the sol solution. In the method of manufacturing a piezoelectric thin film component, a top electrode is formed on the piezoelectric thin film to complete the piezoelectric thin film component.

2 Claims, 14 Drawing Sheets

FOREIGN SUBSTANCES EXIST

FOREIGN SUBSTANCES DO NOT EXIST

METHOD OF MANUFACTURING PIEZOELECTRIC THIN FILM COMPONENT

CROSS-REFERENCE TO RELATED APPLICATION

This application is a division of U.S. application Ser. No. 09/236,110, filed Jan. 25, 1999, now U.S. Pat. No. 6,194,818.

BACKGROUND OF THE INVENTION

1. Field of the Invention

The present invention relates to a piezoelectric thin film component and the manufacturing method thereof. The present invention also relates to an inkjet-recording head using the piezoelectric component, and an inkjet printer using this [head] The present invention more particularly relates to a new improvement of a piezoelectric thin film component where residual strain is minimized.

2. Description of the Related Art

An actuator using a piezoelectric thin film component, which converts electric energy into mechanical energy or vice versa, is used for a pressure sensor, a temperature sensor, an inkjet type recording head, and others. In the inkjet type recording head, a piezoelectric thin film component is used as an actuator to be the drive source of ink ejection.

This piezoelectric thin film component generally comprises a piezoelectric thin film comprised of polycrystalline substances, and a top electrode and bottom electrode which are disposed sandwiching the piezoelectric thin film. The composition of the piezoelectric thin film is generally a binary system in which the main component is lead zirconate titanate (hereafter "PZT"), or a ternary system where a third component is added to the binary system.

The piezoelectric thin films with such composition are generated, for example, by a sputtering method, sol-gel method, MOD process (Metal Organic Decomposition process), laser ablation method and CVD method. For example, a ferro-electric substance using the binary system PZT is noted in "Applied Physics Letters, 1991, Vol. 58, No. 11, pp. 1161~1163". Also, piezoelectric materials using the binary system PZT is disclosed in Japanese Patent Laid-Open No. 6–40035, and in the "Journal of the American Ceramic Society, 1973, Vol. 56, No. 2, pp. 91~96".

When a piezoelectric thin film component is applied to an inkjet type recording head, for example, a piezoelectric thin film (PZT film) with a 0.4 $\mu m$~20 $\mu m$ film thickness is appropriate. The piezoelectric thin film needs a high piezoelectric charge constant, therefore it is normally necessary to perform heat treatment at a 700° C. or higher temperature to grow crystal grains of the piezoelectric thin film.

When a piezoelectric thin film (PZT film) with a 0.5 $\mu m$ or higher film thickness is formed, performing heat treatment to obtain a high piezoelectric charge constant causes cracks inside the film, which is a problem.

A method disclosed in "Philips J. Res. 47 (1993) pp. 263~285" is creating a sol or gel composition, baking at high temperature to crystallize the piezoelectric thin film, and repeating this process to increase the film thickness of the piezoelectric thin film.

The piezoelectric thin film created by this method, which has a multi-layered interface, cannot present good piezoelectric characteristics, and processability is poor. Repeating the heat treatment also leads to deterioration of piezoelectric characteristics, such as crystals losing orientation.

A piezoelectric thin film is normally formed on a bottom electrode, which is formed on a substrate, and heat treatment performed to form the piezoelectric thin film causes curvature and strain on the substrate, which is a problem. Also good adhesion is required between the bottom electrode and the piezoelectric thin film.

So the present inventor and others considered various ways to increase the piezoelectric charge constant of a piezoelectric thin film, and discovered that it is effective if the crystals of the piezoelectric thin film have a predetermined crystal orientation and columnar structure, and also have a crystal structure with a grain size of 0.1 $\mu m$ to 0.5 $\mu m$ (Japanese Patent Application No. 9-288757).

However, the present inventor and others further examined and discovered the following problem. When an electric field is applied to a virgin state piezoelectric thin film component, residual strain and polarization strain remain in the piezoelectric thin film component, even after the electric field is removed, and good piezoelectric strain characteristics (displacement characteristics) cannot be obtained. In other words, if an electric field is applied to a piezoelectric thin film and this is polarized, the domain (crystal grains) of the piezoelectric materials creating the piezoelectric thin film moves such that the polarization axis matches with the direction of the electric field. Then cavities are generated in the grain boundaries of the grains, which seems to be causing residual strain.

SUMMARY OF THE INVENTION

With the foregoing in view, it is an object of the present invention to provide a mechanism that excels in piezoelectric strain characteristics, eliminating the influence of residual strain in piezoelectric thin films.

After studying piezoelectric thin films that can achieve such an objective in various ways, the present inventor discovered a piezoelectric thin film which has the following characteristics.

No or few foreign substances exist or the abundance of foreign substances is low at grain boundaries, which are boundaries between crystal grains of the piezoelectric thin film, even after performing polarization processing (poling) on the piezoelectric thin film component. The width of the grain boundary is 5 nm or less. The crystal grain boundary is a discontinuous layer, which does not continue the orientation of adjacent crystal grains. Here, "foreign substance" shall mean the non-crystallized substance separated from crystal grains of the piezoelectric thin film.

According to the discovery of the present inventor, such a structure can be favorably implemented by applying the abovementioned MOD process to manufacturing a piezoelectric thin film using a sol-gel method. Foreign substances are compounds which are formed by the constituent elements of PZT, but the composition is different from PZT. That is, foreign substances are, for example, non-crystallized substances separated from crystal grains of the piezoelectric thin film.

An example is lead oxide (PbO). The abundance of foreign substances after applying an electric field to the piezoelectric thin film component can be controlled such that residual strain is within a target range. For example, $2.5 \times 10^{-4}$ or less is preferred. Or a range where the piezoelectric effect can be improved, mentioned later, is preferable. A piezoelectric thin film where foreign substances exist becomes the cause of residual strain after polarization processing, which is clear by the later mentioned x-ray diffraction analysis. The residual strain refers to the strain when the electric field strength is 0 kv/cm.

According to the present invention, the residual strain is small or almost nonexistent since the shift of the domain of the piezoelectric thin film caused by applying an electric field at polarization processing or at the driving of the piezoelectric thin film component is small. This means that the hysteresis characteristic of the piezoelectric thin film component with respect to an applied electric field is low. As a result, a piezoelectric thin film component which has good strain-voltage (electric field) characteristics and a large displacement can be provided.

For the piezoelectric effect, that is, displacement-voltage characteristics of the piezoelectric thin film component of the present invention, the piezoelectric constant $d_{31}$ to be an index is 180 pC/N or more, and it is possible to obtain a 1.2 times or higher piezoelectric constant compared with a conventional type.

Displacement of a piezoelectric film is generated by the shift of the relative position of metal atoms and oxygen atoms when voltage is applied to the piezoelectric thin film component. As a result of the shift of domains, cavities are generated at the grain boundaries between domains (between adjacent crystal grains). And the existence of these cavities decreases the withstand voltage of the piezoelectric thin film.

The present inventor has confirmed that decreasing foreign substances decreases residual strain. Also in the present invention, decreasing the width of the crystal grain boundary of the piezoelectric thin film leads to control of the crystal grain boundaries themselves, which are the source of cavities which cause residual strain.

It is preferable that crystal grains of the piezoelectric thin film be columnar with respect to the top and bottom electrodes, and that the crystal plane orientation be a (001) plane orientation of the tetragonal system or a (111) plane orientation of the rhombohedral system. A (100) plane orientation is also acceptable.

Crystallization of a piezoelectric thin film by a sol-gel method or MOD process begins from the lower electrode side, so an improvement is required to control the crystal orientation of the piezoelectric thin film elements. For this, forming seed crystals to form crystals of the piezoelectric thin film on the bottom electrode is possible.

Seed crystals (crystal source) are comprised of titanium, and are formed on platinum crystals which comprise the bottom electrode, or on the crystal grain boundaries. The above piezoelectric thin film has a crystal plane orientation described above, and has a columnar crystal structure with a 0.1 μm to 0.5 μm grain size.

More preferably, a crystal of piezoelectric film grown using a crystal source formed on the crystal grain boundary of the bottom electrode as the nucleus is formed on a plurality of crystal grains of the bottom electrode. This improves adhesion between the piezoelectric thin film and the bottom electrode.

Another piezoelectric thin film component of the present invention is characterized in that the grain size of the above-mentioned bottom electrode is set to a preferable grain size for the above-mentioned piezoelectric materials to display piezoelectric characteristics, and the grain size of the above-mentioned crystals of the piezoelectric materials are grown with the above-mentioned crystal source as the nucleus, so that [the grain size] becomes almost the same value as or higher than the grain size of the above-mentioned bottom electrode.

An inkjet type recording head of the present invention is characterized in that the above-mentioned piezoelectric thin film component is comprised as an actuator. In one embodiment, the inkjet type recording head comprises a substrate where ink chambers are created, a diaphragm which seals one face of the ink chambers and has a piezoelectric thin film component in strain vibration mode fixed on the surface, and a nozzle plate which seals the other face of the above-mentioned ink chambers and has nozzle holes for ejecting ink, and the above-mentioned piezoelectric thin film component comprises the piezoelectric thin film component described above.

If island-like seed crystals are formed between platinum crystal grains comprising the bottom electrode, then crystals grow in a columnar structure using seed crystals as the nucleus and a crystal structure with a predetermined plane orientation is created. However, to obtain a (111) orientation, this island-like titanium is not used.

If the crystals of the bottom electrode are set to the preferable grain size for the above piezoelectric materials to display piezoelectric characteristics and the crystals of the above-mentioned piezoelectric materials are grown using the above crystal sources as the nucleus, then the crystal grain size of the above-mentioned piezoelectric materials can be a value almost equal to or higher than the grain size of the bottom electrode. In other words, a grain size which exceeds the grain size of the bottom electrode can be implemented because in this structure a crystal of the piezoelectric thin film can be formed on a plurality of crystals of the bottom electrode. If the crystal sources are formed on the grain boundaries which are hardly influenced by the orientation of the crystals of the bottom electrode, then the crystals of the piezoelectric thin film can be grown using the crystal sources as the nucleus, and as a result the targeted orientation of the crystals of the piezoelectric thin film can be implemented.

The present invention is also characterized in that in a piezoelectric thin film component comprising a piezoelectric thin film which strains when an electric field is applied, the residual strain of the above-mentioned piezoelectric thin film is $2.5 \times 10^{-4}$ or less. The piezoelectric constant is preferably 150 pC/N or more. The present invention is also characterized in that the present invention is an actuator using these piezoelectric thin film components as an oscillation source.

EXPLANATION OF THE REFERENCE NUMERALS AND SIGNS IN THE DRAWINGS

1. Silicon substrate
2. Silicon oxide film
3. Titanium oxide film
4. Bottom electrode
5. Top electrode

DESCRIPTION OF THE PREFERRED EMBODIMENTS

Figure 1:
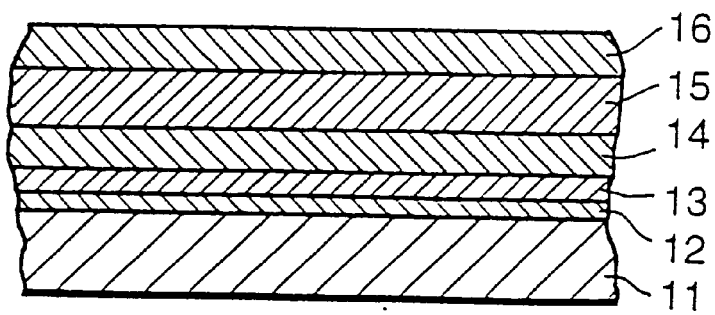
FIG. 1 is a schematic depicting a structure of a piezoelectric component in accordance with the present invention.

Embodiments of the present invention will now be described with reference to the accompanying drawings. In the present embodiments, a case when a PZT film is formed as a piezoelectric film is described. FIG. 1 is a schematic depicting a structure of a piezoelectric component in accordance with the present invention. As FIG. 1 shows, the piezoelectric thin film component comprises a silicon substrate 11, a silicon oxide film formed on the silicon substrate 11, a titanium oxide film (Ti/TiO2/Ti, etc.) 13 formed on the silicon oxide film 12, a bottom electrode 14 formed on the titanium oxide film 13, a PZT film formed on the bottom electrode 14, and a top electrode 16 formed on the PZT film 15. The titanium oxide film is for improving adhesion between the bottom electrode and the PZT thin film. The top and bottom electrodes respectively are comprised of platinum for example.

Figure 14:
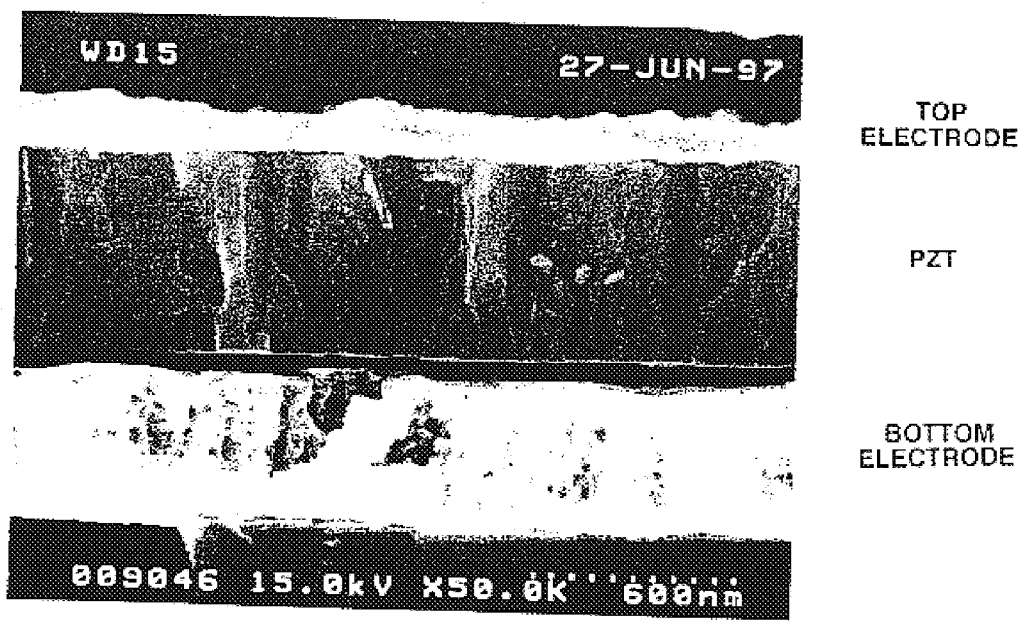
FIG. 14 is an electron microscopic photograph indicating the crystal structure of the piezoelectric component in accordance with the present invention, and is a cross-section in the film thickness direction.
Figure 15:
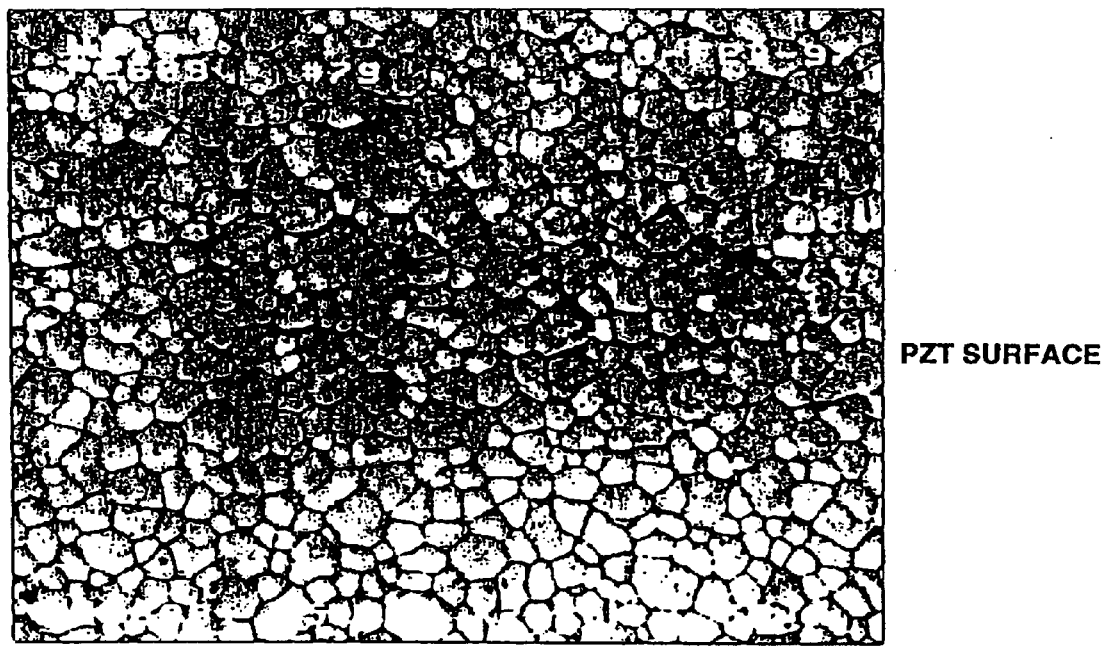
FIG. 15 is an electron microscopic photograph, and is a crystal structure on the plane of the PZT thin film.

The PZT film is comprised of a polycrystalline substance, and the grain boundaries of the crystal grains exist roughly in a vertical direction with respect to the planes of the top and bottom electrodes 14 and 16, that is, in the film thickness direction of the piezoelectric thin film, as FIG. 14 and FIG. 15 show. In other words, the crystal grains of PZT are in a columnar structure, as described later.

The crystal structure of the PZT film 15 is mainly oriented in one of the crystal plane orientations described above.

"Degree of orientation" here is defined as, for example,

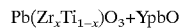

where the reflection strength of a plane in a plane orientation (XYZ) of the PZT film is I (XYZ) according to the wide angle XRD method.

For the PZT film 15, a composition in which the main component is a binary system, or a composition in which the main component is a ternary system, where a third component is added to the binary system, is favorable. A preferable example of the binary system PZT is one having a composition represented by chemical formula $Pb(Zr_xTi_{1-x})O_3+YpbO$ (where $0.40 \leq x \leq 0.6$, $0 \leq Y \leq 0.3$).

A preferable example of the ternary system PZT is one having a composition represented by the following chemical formula where the third component is added to the above-mentioned binary PZT.

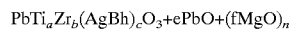

(where A is a bivalent metal selected from a group of Mg, Co, Zn, Cd, Mn and Ni, or a trivalent metal selected from a group of Sb, Y, Fe, Sc, Yb, Lu, In and Cr. B is a pentavalent metal selected from a group of Nb, Ta and Sb, or a hexavalent metal selected from a group of W and Te.

a+b+c=1, $0.35 \leq a \leq 0.55$, $0.25 \leq b \leq 0.55$, $0.1 \leq c \leq 0.4$, $0 \leq e \leq 0.3$, $0 \leq f \leq 0.15$, c, g=f=½ and n=0, however if A is a trivalent metal and B is not a hexavalent metal, or if A is a bivalent metal and B is a pentavalent metal, then g is ⅓ and h is ⅔, and only if A is Mg and B is Nb, n is 1.)

A preferred example of the ternary system is magnesium-lead niobate, that is, a compound where A is Mg, B is Nb, g is ⅓ and h is ⅔.

For both the binary system PZT and ternary system PZT, a very small amount of Ba, Sr, La, Nd, Nb, Ta, Sb, Bi, W, Mo and Ca may be added. For the ternary system, in particular, adding 0.10 mol % or less of Sr or Ba is preferred to improve the piezoelectric characteristics. For the ternary system, adding 0.10 mol % or less of Mn or Ni is preferred to improve the degree of sintering.

Figure 2A:
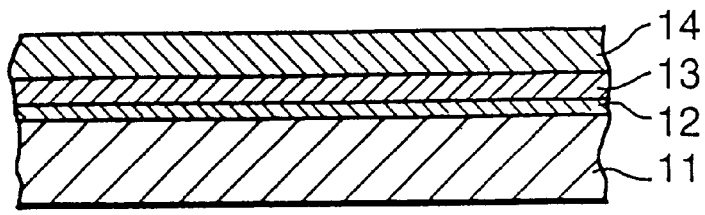
FIGS. 2(a) to 2(c) are is cross-sectional views depicting the manufacturing process of the piezoelectric thin film component.
Figure 2B:
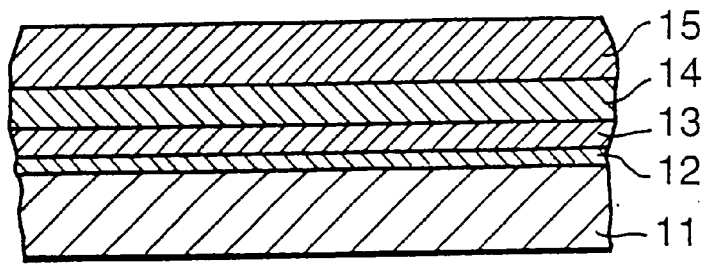
Figure 2C:
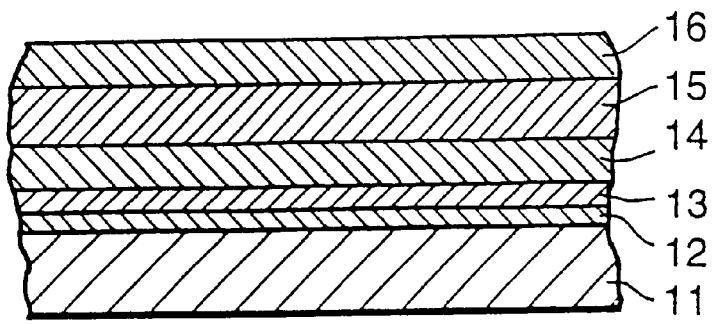

Next a method for manufacturing a piezoelectric thin film component having this structure will be described with reference to the drawings. FIG. 2(a) to FIG. 2(c) are cross-sectional views depicting the manufacturing process of the above-mentioned piezoelectric thin film component. In the process shown in FIG. 2(a), thermal oxidation is performed on the silicon substrate 11 to form a silicon oxide film 12 with a 0.3 μm~1.2 μm film thickness on the silicon substrate 11. Then a titanium oxide film 13 with a 0.01 μm to 0.04 μm film thickness is formed on the silicon oxide film 12 by a sputtering method. Then the bottom electrode 14 comprised of platinum is formed on the titanium oxide film 13 by a sputtering method such that the crystal grain size becomes 0.01 μm to 0.3 μm and the film thickness becomes 0.2 μm~0.8 μm.

In the process shown in FIG. 2(b), island-like titanium is formed using a sputtering method on the bottom electrode 14 formed in the process shown in FIG. 2(a). The island-like titanium can be formed by forming the film thickness of this titanium to be 40 to 60 angstrom.

The crystal structure of the piezoelectric thin film grown using this titanium as the crystal source has a (001) or (100) plane orientation, and a crystal grain size of 0.1 μm to 0.5

μm. The process to form island-like titanium is not used if the crystal system of the PZT thin film is to be a rhombohedral system (111).

This manufacturing method is a method for adjusting inorganic oxide by baking stably-dispersed sol while controlling the hydrolysis of metal alkoxide and acetate using alkanol amine or acetylacetone. This manufacturing method is comprised of the following processes.

a. Sol Composition Film Formation Process

In the present embodiment, the composition for manufacturing a PZT thin film can be adjusted by dispersing alkoxide or acetate, which are metal components of sol for comprising PZT film and which can form the PZT film, in a main solvent, 2-n-butoxyethanol, for example. At this time, 2,2' iminodiethanol (hydrolysis inhibitor for alkoxide or acetate) is also added to the solution.

In the present invention, the composition of the above-mentioned PZT film can be obtained by controlling the composition of metals in sol. In other words, alkoxide or acetate in titanium, zirconium, lead and other metal components is used as starting material.

An advantage here is that the composition of metal components comprising the PZT film is almost fully maintained until the final PZT film (piezoelectric thin film) is formed. This means that changes of metal components, especially a lead component, caused by evaporation and other factors during baking and annealing are extremely few, therefore the composition of metal components in these starting materials is the same as the metal composition in the PZT film which is finally obtained. Therefore the composition of sol is defined according to the piezoelectric film (the PZT film in this embodiment) to be generated.

Also in the present embodiment, it is preferred to set the lead component in sol to be a maximum of 20 mol %, preferably 15 mol %, more than the stoichiometric requirement, so that the PZT film obtained will not have the above-mentioned lead component shortage due to the evaporation of lead components.

In the present embodiment, it is preferred that sol be used as a composition mixed with an organic high molecular compound. This organic high molecular compound absorbs the residual stress of the thin film during drying and baking, so that cracking of the thin film is effectively prevented. In concrete terms, the use of gel containing organic high molecules generates pores in the gelatinized thin film, which is described later. These pores absorb the residual stress of the thin film during the pre-annealing and annealing process, which are also described later.

The preferred organic high molecular compounds used here are polyvinyl acetate, hydroxypropyl cellulose, polyethylene glycol, polyethylene glycol monomethyl ether, polypropylene glycol, polyvinyl alcohol, polyacrylic acid, polyamide, polyamic acid, acetylcellulose and its derivatives, and copolymers of these compounds.

In the present embodiment, a porous gel thin film, where a large number of about 0.05 μm sized pores exist, can be formed by adding polyvinyl acetate, and a porous gel thin film where 1 μm or less sized pores are distributed over a wide range can be formed by adding hydroxypropyl cellulose.

In the present embodiment, a mean molecular weight of 285~800 is preferable for polyethylene glycol. Also a mean molecular weight of 300~800 is preferable for polypropylene glycol.

In the manufacturing method in accordance with the present embodiment, the sol composition is coated on the bottom electrode 14 (see FIG. 2(*b*)) where the PZT film 15 is to be formed. The coating method at this time is not particularly restricted, but normally used methods, which are for example, spin coat (1500 turns/minute), dip coat, roll coat and bar coat, can be used. Coating by flexo printing, screen printing and offset printing is also possible.

For the thickness of a layer of the film to be formed by an above-mentioned coating, it is preferred to control the process such that the thickness of the porous gel thin film to be formed in the gelatinization process, described later, becomes 0.1 μm to 0.3 μm, more preferably around 0.15 μm.

Then the coated sol composition is naturally dried or heated at a 200° C. or less temperature (for example 10 minutes, at 180° C.). Here the film thickness can be increased by coating the above sol composition again on the dried (heated) film. In this case, it is preferred that the film to be the substrate be dried at an 80° C. or higher temperature.

b. Gelatinization Pocess of Sol Composition Film

Next the film formed in the above-mentioned sol composition film formation process is baked so that a porous gel thin film comprised of amorphous metal oxides, which is substantially free of residual organic substances, is formed. Baking is performed by heating for a sufficient time at a sufficient temperature for gelatinizing the film of the sol composition and for removing organic substances from the film.

In this embodiment, the baking temperature is preferred to be 300~500° C., and more preferably 380~420° C. The baking time changes depending on the temperature and the type of furnace to be used, but when a degreasing furnace is used, for example, 10~120 minutes is preferred, and 15~60 minutes is more preferable. When a hot plate is used, 1~60 minutes is preferred, and 5~30 minutes is more preferable. By the above processes, the porous gel thin film is formed on the bottom electrode 14.

c. Pre-annealing Process

Next the porous gel thin film formed in the above-mentioned process "b" is baked so that this film is transformed to a film comprised of a crystalline metal oxide film. Baking is performed at a temperature required for transforming the porous gel thin film to a film comprised of a crystalline metal oxide, but baking need not continue until perovskite crystals occupy most of the crystals, and baking can end when the gel thin film is uniformly crystallized. In the present embodiment, a 500~800° C. range is preferred as the baking temperature, and baking at a 550~750° C. range is more preferable. The baking time changes depending on the baking temperature and the type of the furnace to be used, but when an annealing furnace is used, for example, 0.1~5 hours is preferred, and 0.5~2 hours is more preferable. When an RTA (Rapid Thermal Annealing) furnace is used, 0.1~10 minutes is preferred, and 1~5 minutes is more preferable. Here heating was performed using an RTA in an oxygen atmosphere for 5 minutes at 600° C. and 1 minute at 725° C.

Also in the present embodiment, this pre-annealing process can be performed in two stages. In concrete terms, annealing is performed at a 500~600° C. temperature range in the first stage, and then annealing is performed at a 600~800° C. temperature range in the second stage. More preferably, annealing is performed at a 500~550° C. temperature range in the first stage, and at a 600~750° C. range in the second stage. By this process, the porous gel thin film is transformed to a film comprised of a crystalline metal oxide film.

d. Repeat Process

Next the above-mentioned processes "a" and "b" are repeated 3 more times to laminate 4 layers of polycrystalline gel thin film, then [the film] is transformed to a film comprised of a metal oxide film by the pre-annealing process of process "c".

If a piezoelectric thin film in (100) or (001) orientation is to be formed next, island-like titanium is formed on PZT by the above described method, and the above described processes "a", "b" and "c" are repeated 4 more times.

The number of layers of the laminated film obtained after this repeat process may be determined considering the film thickness of the final PZT film 15. Here, 0.15 µm per layer is preferred. Needless to say, a film thickness where cracks do not occur in the next process (process "e"), which is described later, is preferred.

In this repeat process, a new porous gel thin film is formed on the previously formed film, and the newly formed porous gel film becomes a substantially integrated film with the previously formed film as a result of subsequent pre-annealing.

The substantially integrated film is not limited to a film where a discontinuous layer does not exist between the laminated layers, but may have a discontinuous layer between the laminated layers, unlike the case of the PZT film which is finally obtained in the present embodiment. If the processes "a" and "b" are again repeated, another new porous gel thin film is formed, and this new porous gel thin film becomes a substantially integrated film with the above-mentioned crystalline laminated film as a result of subsequent pre-annealing.

6. Perovskite Crystal Growth Process (Final Annealing)

Next, the film obtained in the above process "d" is annealed at a baking temperature of 600~1200° C., and more preferably in an 800~1000° C. range. The baking time changes depending on the baking temperature and the type of furnace to be used, but when an annealing furnace is used, for example, 0.1~5 hours is preferred, and 0.5~2 hours is more preferable. When an RTA furnace is used, 0.1~10 minutes is preferred, and 0.5~3 minutes is more preferable. Here, this process was performed using the above-mentioned RTA in an oxygen atmosphere for 5 minutes at 650° C. and 1 minute at 900° C.

Also, in the present embodiment, this perovskite crystal growth process, that is, annealing, can be performed in two stages. In concrete terms, annealing is performed at a 600~800° C. temperature in the first stage, and then at 800~1000° C. in the second stage. More preferably, annealing is performed at a 600~750° C. temperature in the first stage, and at an 800~950° C. temperature in the second stage.

By the above operation, PZT, which has a grain size of 0.1 µm to 0.5 µm and a film thickness of 1.2 µm, comprised of columnar polycrystalline substances, is formed on the bottom electrode 14. Next the effect of titanium on the crystallization of PZT will be described. This effect has been confirmed by the present inventor using a scanning electron microscopy (SEM).

In FIG. 1, island-like titanium has been formed on the grain boundaries of the bottom electrode 14 by a sputtering method. The crystal grain size of the bottom electrode is 0.01 to 0.3 µm. It is possible to form the bottom electrode to be columnar crystals with such a crystal grain size, because platinum, which has an FCC structure, easily becomes columnar crystals, and the crystal grain size can be controlled by the film forming speed during sputtering.

If forming island-like titanium crystals on the surface of the bottom electrode is attempted, island-like crystals of titanium tend to be formed on the boundaries between platinum crystals where the surface energy of platinum is low. At this time, a PZT crystal grain, which grows using titanium as the nucleus, is formed on a plurality of titanium crystals.

Figure 3A:
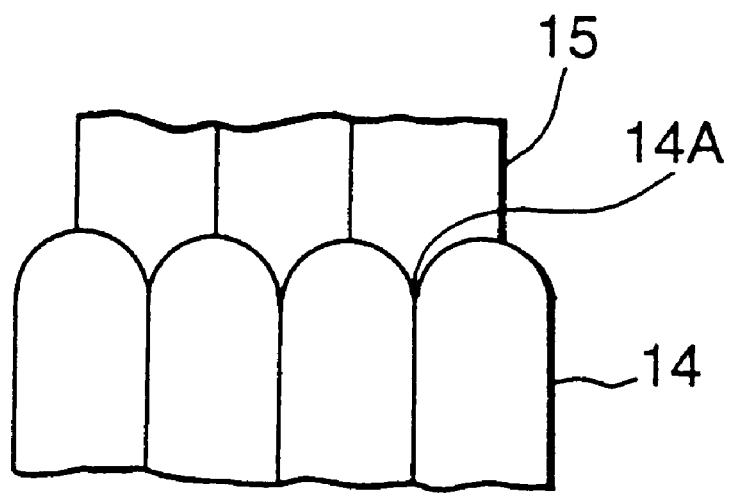
FIGS. 3(a) and 3(b) are is schematics depicting the PZT crystal formation process confirmed by a scanning electron microscopy (SEM)
Figure 3B:
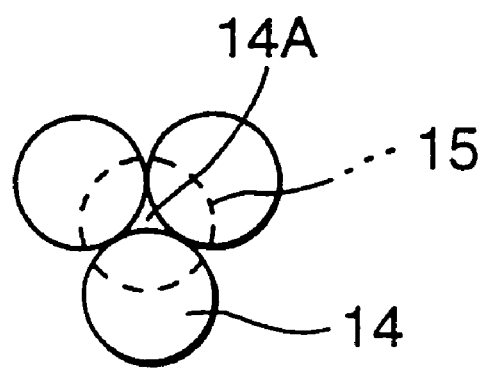
Figure 4:
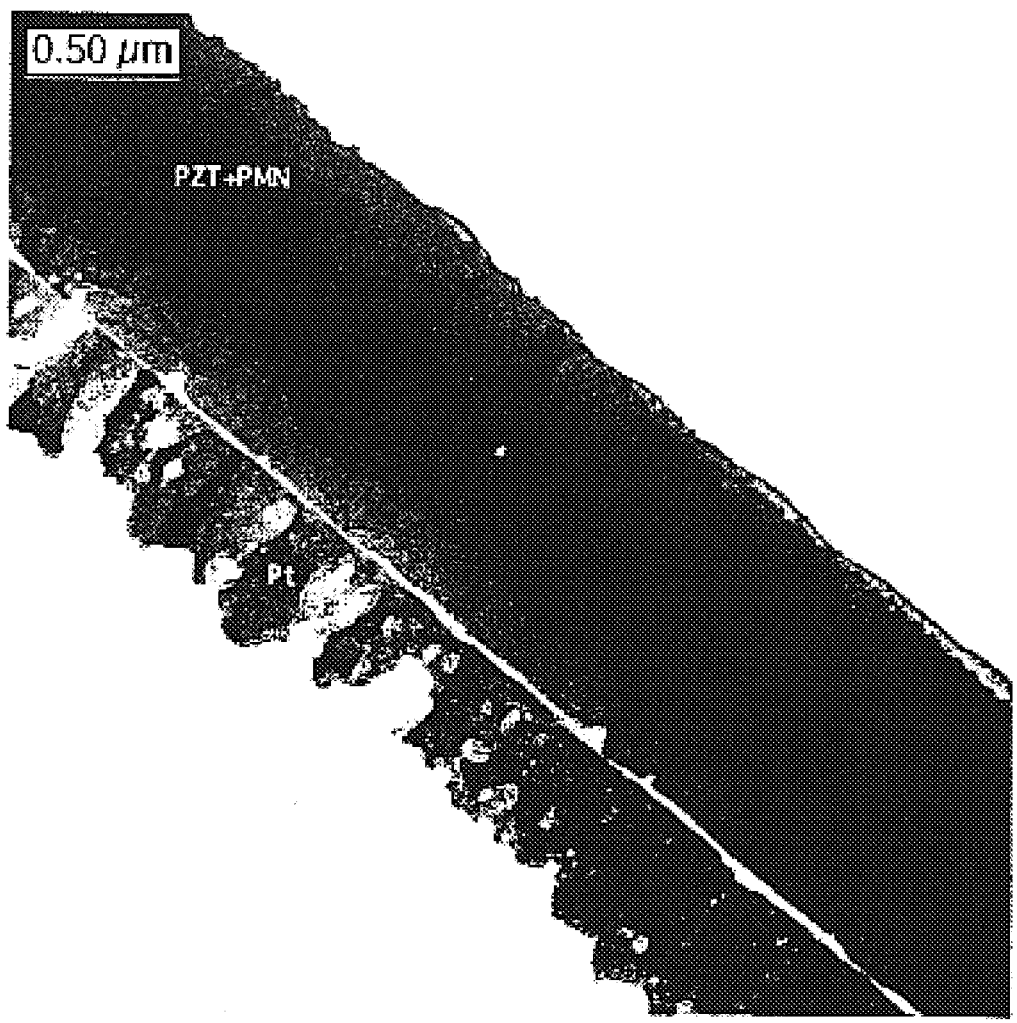
FIG. 4 is its actual electron microscopic photograph.

FIGS. 3(*a*) and 3(*b*) are schematics depicting a PZT crystal formation process confirmed by a scanning electron microscopy (SEM), where FIG. 3(*a*) is a drawing along the height direction of the PZT crystal, and FIG. 3(*b*) is a drawing along the diameter (width) direction of the PZT crystal. FIG. 4 is its actual electron microscopic photograph, where columnar PZT crystals have been formed on the Pt electrode. The titanium crystals 14A have been formed on the grain boundaries of the bottom electrode crystals 14.

If PZT is grown using titanium crystals as the nucleus, crystal grains of the PZT grow such that one grain is formed on a plurality of adjacent platinum crystals of the bottom electrode. Normally manufacturing is easy with Pt, which has a stable (111) orientation, and if titanium seed crystals are formed on crystal grain boundaries which are less influenced by the orientation of platinum, it is possible to form PZT crystals to be columnar crystals with a (100) and (001) orientation, which are not influenced by the crystal orientation of platinum. Since a crystal grain of the PZT is formed on a plurality of crystals of the bottom electrode, an improvement of adhesion with the bottom electrode is expected.

Figure 5:
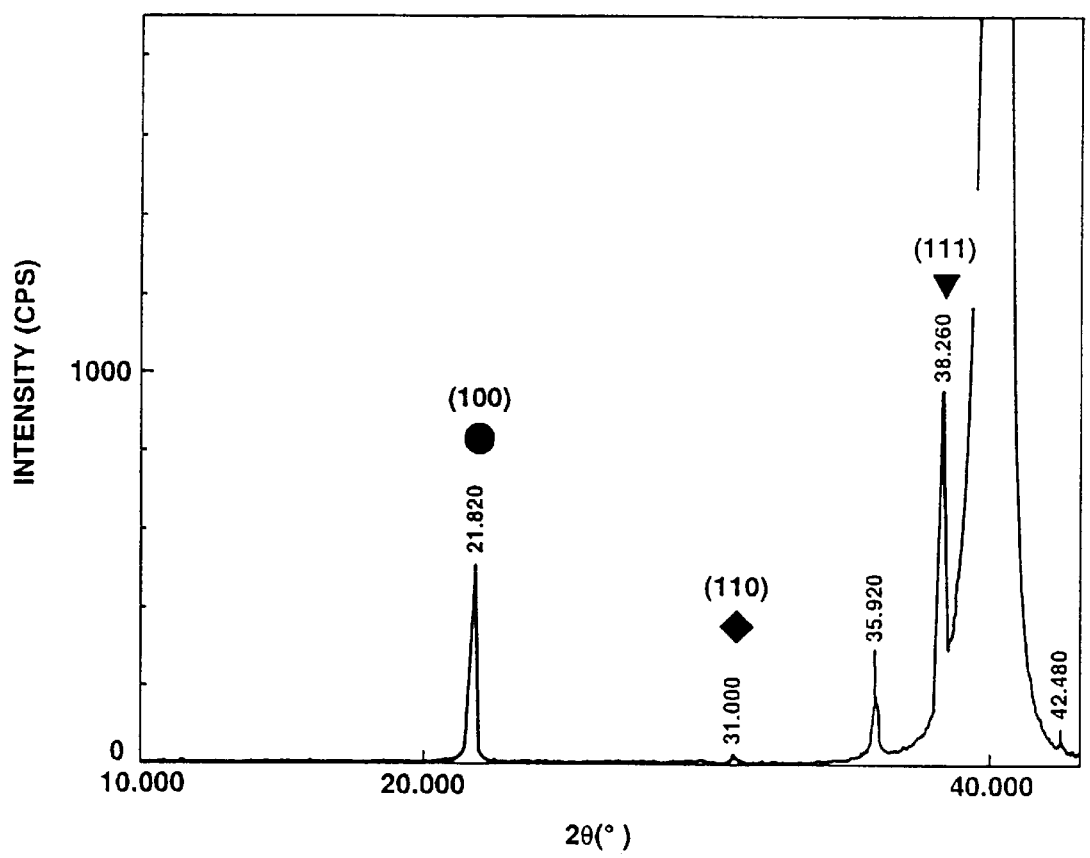
FIG. 5 is a chart of x-ray diffraction analysis (XRD) when a piezoelectric thin film PZT is formed on the bottom electrode where island-like titanium is formed.
Figure 6:
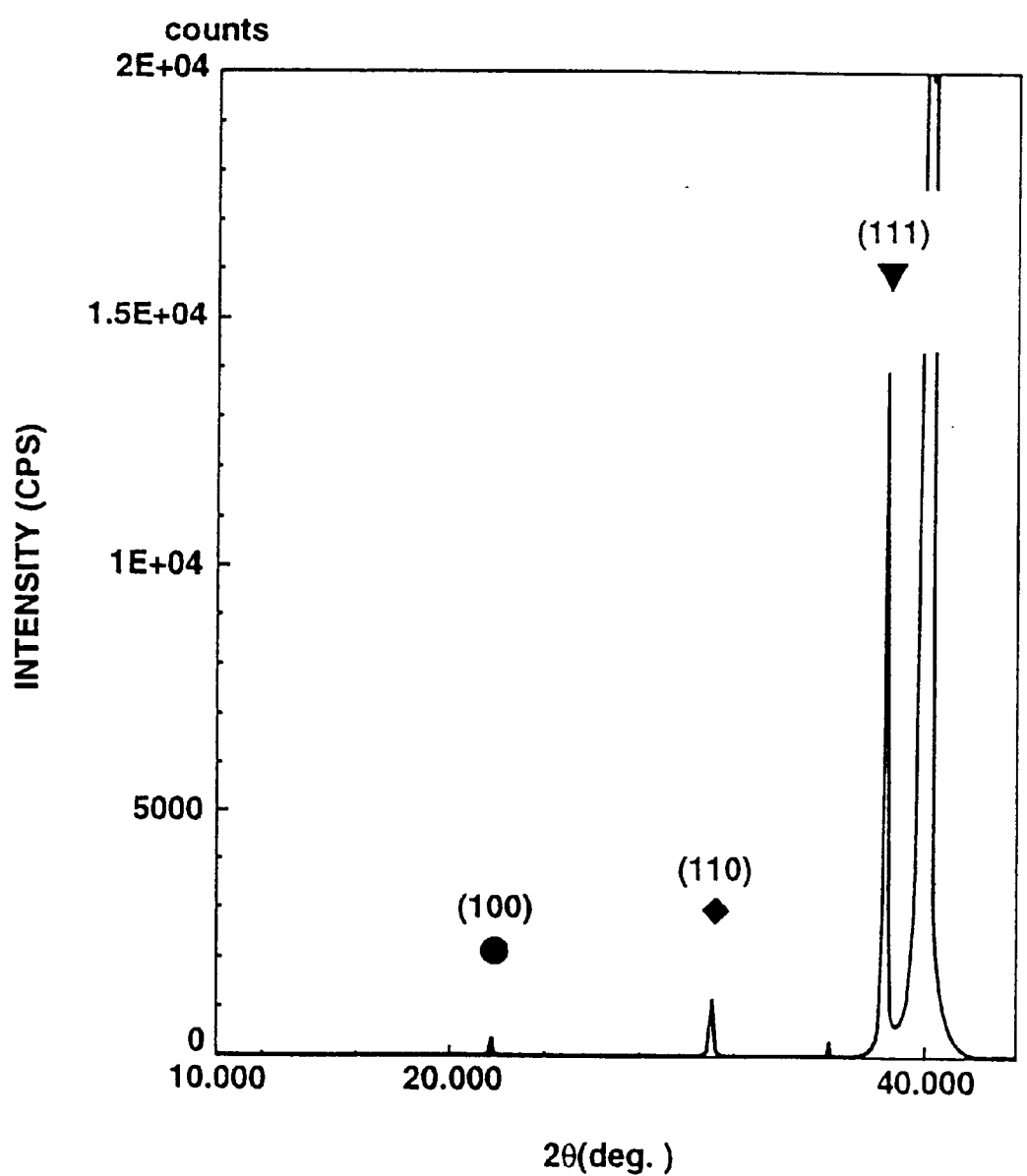
FIG. 6 is a chart when the island-like titanium is not formed.

FIG. 5 is a chart of x-ray diffraction analysis (XRD) when a piezoelectric thin film PZT is formed on the bottom electrode where island-like titanium is formed, and FIG. 6 is a chart when the island-like titanium is not formed. In a comparison of FIG. 5 and FIG. 6, when the island-like titanium is not formed, the orientation of the PZT film tends to have (111) orientation, and the piezoelectric constant is 180 pC/N. When the island-like titanium is formed, on the other hand, PZT tends to have a (100) or (001) orientation, with a higher ratio than (111) orientation, and as a result, the piezoelectric constant is high, 190 pC/N. The piezoelectric constant here was determined from the displacement (strain)-voltage characteristic, and indicates the piezoelectric effect when the applied electric field is 250 kv/cm.

When three more layers of the PZT layer, where island-like titanium is formed, are sequentially formed, and when four sequentially formed layers of PZT, where island-like titanium is formed, are crystallized, PZT crystallizes using the titanium as the nucleus as described above, and other PZT also crystallizes according to the crystal grain size and crystal structure of adjacent PZT. The island-like titanium between the PZT layers also controls the crystallization of PZT on the titanium as described above.

Figure 9:
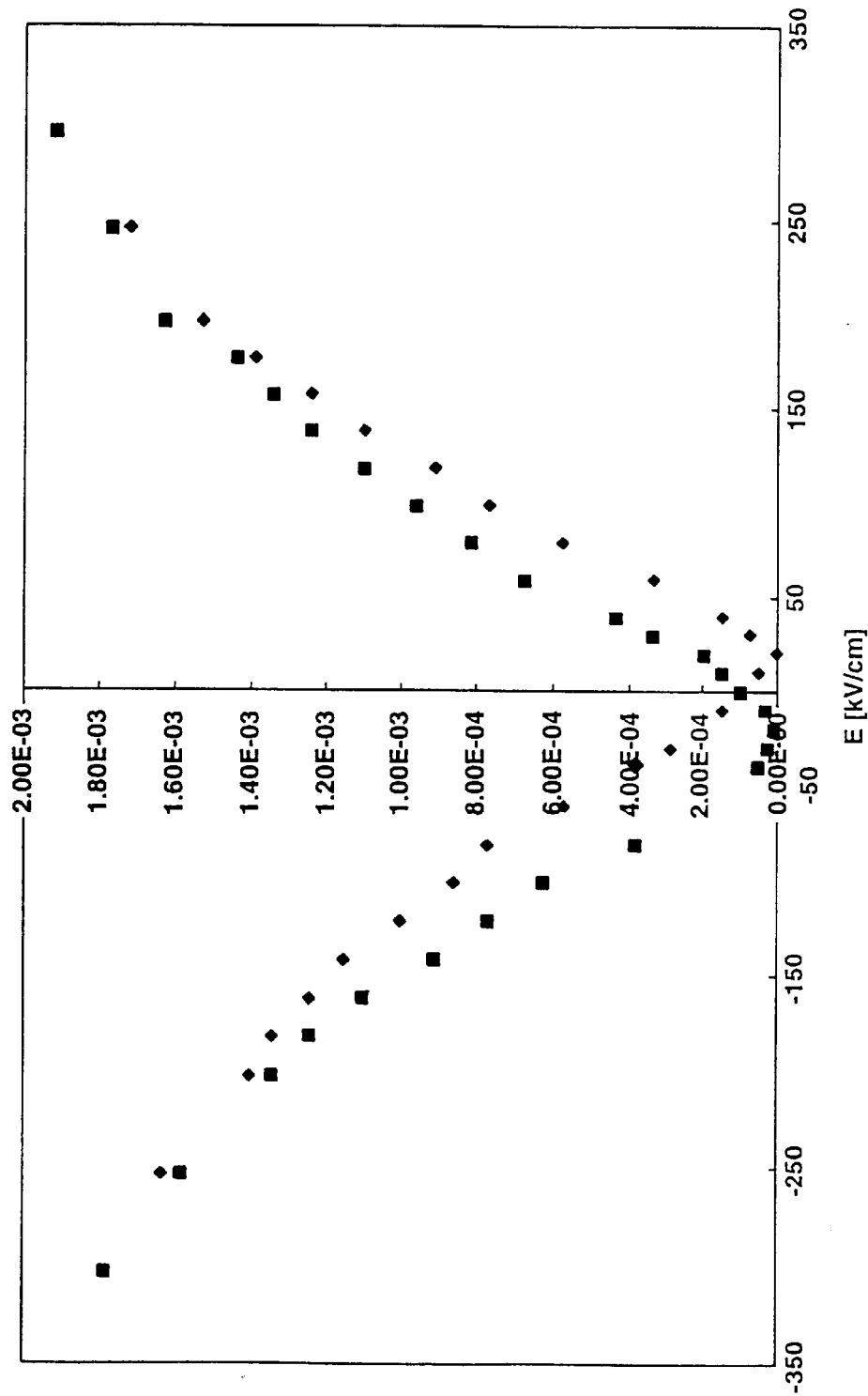
FIG. 9 is a characteristic diagram of the comparison example indicating the measurement result when the residual strain of the present invention and the comparison example were measured under conditions where temperature is constant and the electric field is gradually increased and decreased.
Figure 10:
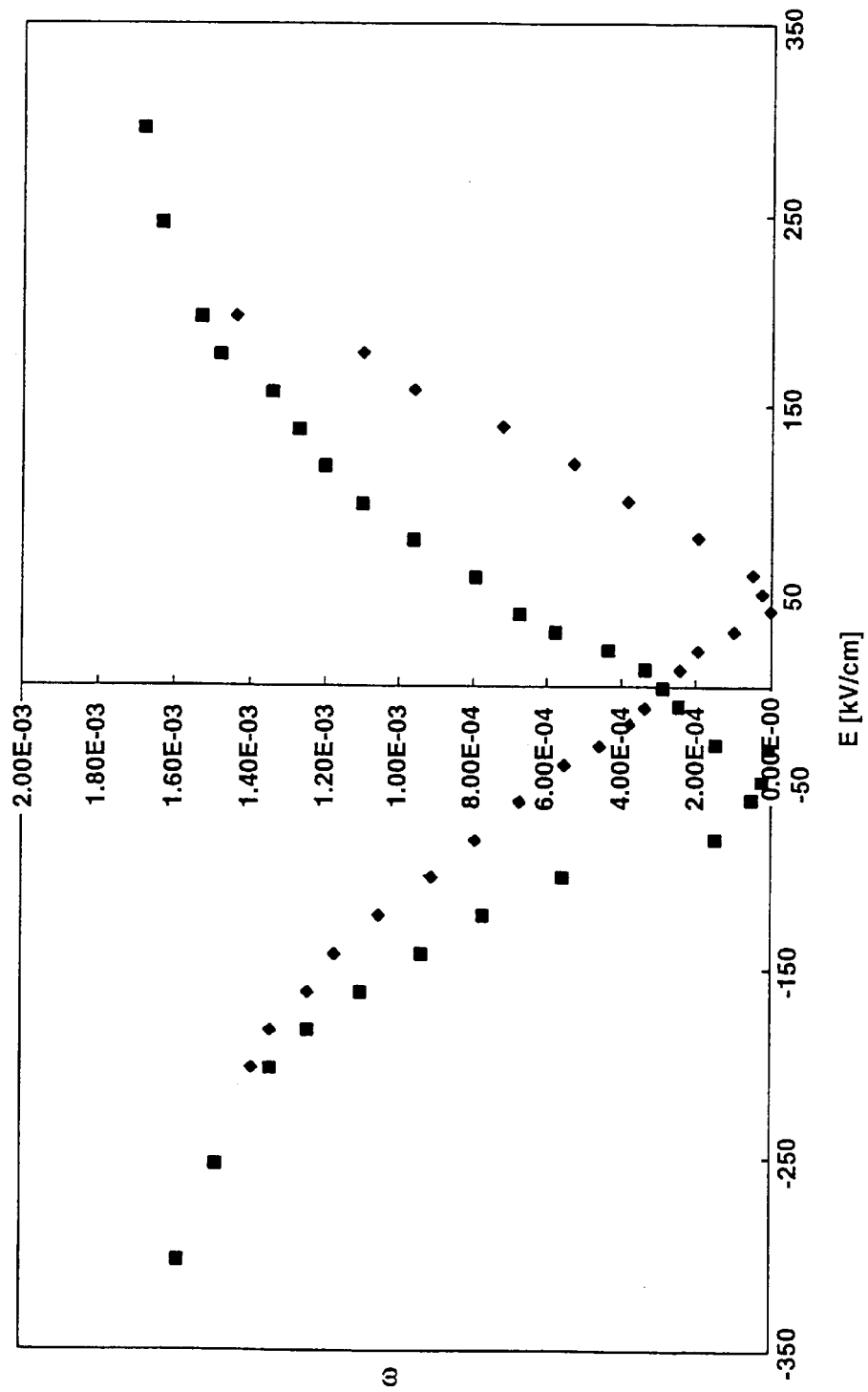
FIG. 10 is a characteristic diagram indicating the measurement result when the residual strain of the present invention and the comparison example were measured under conditions where temperature is constant and the electric field is gradually increased and decreased, and a result when the samples were created by MOD process.

The piezoelectric charge constant was determined from the strain-voltage characteristic of the cantilever shown in FIG. 9 and FIG. 10. In other words, the piezoelectric constant ($d_{31}$,) is calculated from measured displacement δ which is obtained from the following formula, thickness H and Young's modulus YSi of the Si substrate, Poisson's ratio v, Young's modulus $Y_{PZT}$ of the piezoelectric film, free length L of the cantilever and applied voltage V.

$$\delta = d_{31} \cdot V \cdot (Y_{PZT}/Y_{si}) \cdot (3L^2/H^2) \cdot ((1-V_{si})/(1-V_{PZT}))$$

Since strain e and displacement δ have the following relationship, strain e can be calculated.

t is the thickness of the piezoelectric film.

$$e = (H^2/(3(1-V_{si}) t L^2)$$

Figure 7:
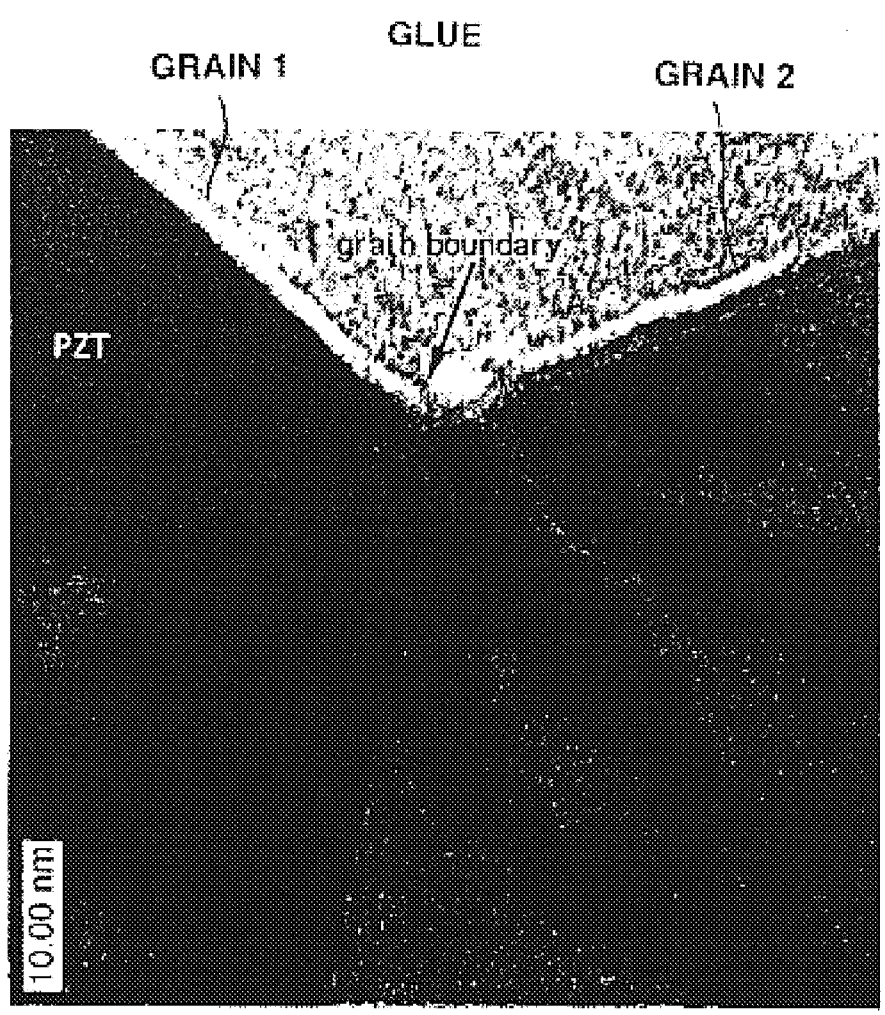
FIG. 7 is an XTEM image of the piezoelectric thin film obtained here.
Figure 8:
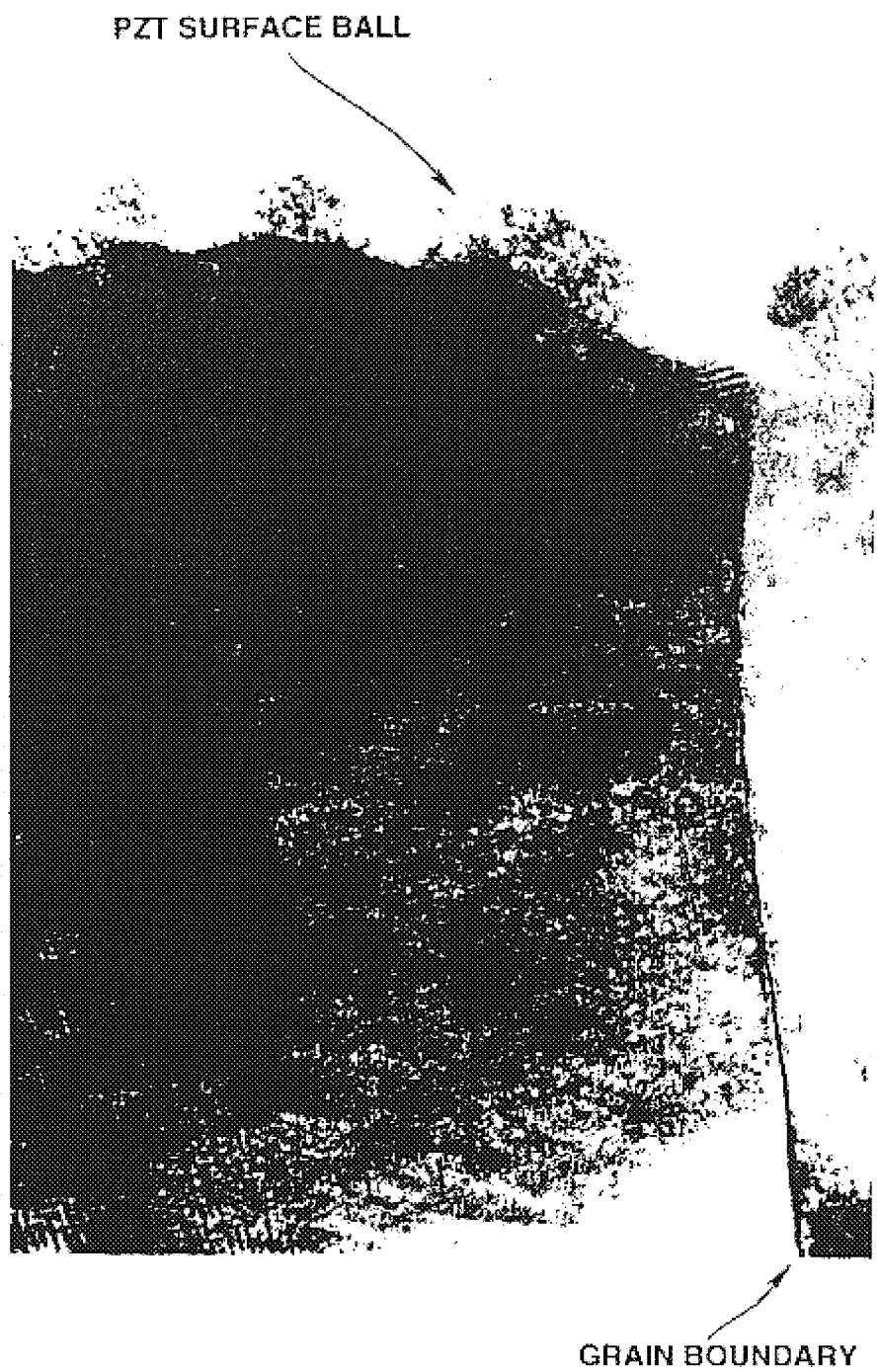
FIG. 8 is an XTEM image of a piezoelectric thin film created as a comparison example of the present invention.

FIG. 7 is an XTEM image of the piezoelectric thin film obtained here. According to examination by the present inventor, the crystal grain boundary between two adjacent crystals (grain 1 and grain 2) was about 5 nm or less. There were some crystal grain boundaries which were hardly observed. FIG. 8, on the other hand, is an XTEM image of a piezoelectric thin film created as a comparison example of the present invention. To form the film of this comparison example, hydrolysis was accelerated more than necessary by adding excessive water, which is 10 mol per 1 mol of PZT, in sol first, then final annealing was performed at 650° C. for 5 minutes and at 700° C. for 1 minute. According to the measurement by the present inventor, the crystal grain boundary had a 7~12 nm or more width.

Then residual strain with respect to the applied electric field w as measured f or the piezoelectric thin film obtained by the present embodiment and for the piezoelectric thin film in FIG. 8 as a comparison example.

FIG. 9 and FIG. 10 are characteristic diagrams indicating the measurement result when the residual strain of both films were measured under conditions where temperature is constant and the electric field is gradually increased and decreased. FIG. 9 is a characteristic diagram of the comparison example. FIG. 10, on the other hand, is t he result of the film created by an MOD process. The result of the latter film shows that residual strain decreased dramatically compared with former film. Decreasing residual strain makes the piezoelectric characteristics of the piezoelectric thin film of the present invention $d_{31}$ or more, making it possible to display almost 1.2 times piezoelectric strain characteristics compared with a conventional film. Residual strain was measured using a cantilever. Initial displacement when voltage is zero corresponds to residual strain. Compared with a piezoelectric thin film which crystal grains are uniform in a columnar direction, that is, crystal grain boundaries are formed almost at right angles to the top and bottom electrodes, residual strain increases for a bulky film where crystal grain boundary directions are random.

Figure 11:
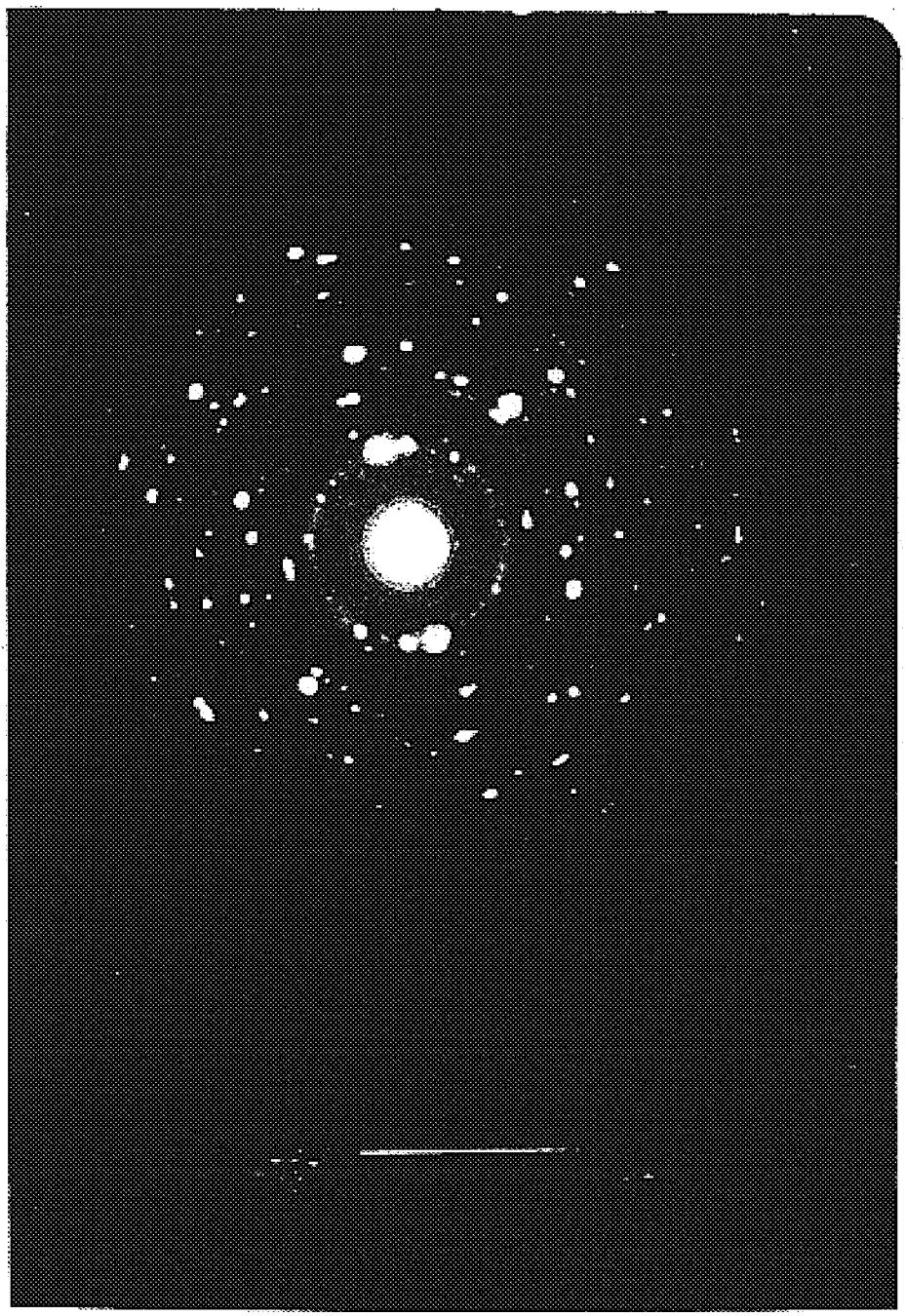
FIG. 11 is a diagram to show an electron beam diffraction pattern obtained under the conditions of the selected-area diffraction in a test on foreign substances in grain boundaries of a piezoelectric thin film, and indicates a pattern of the comparison example.
Figure 12:
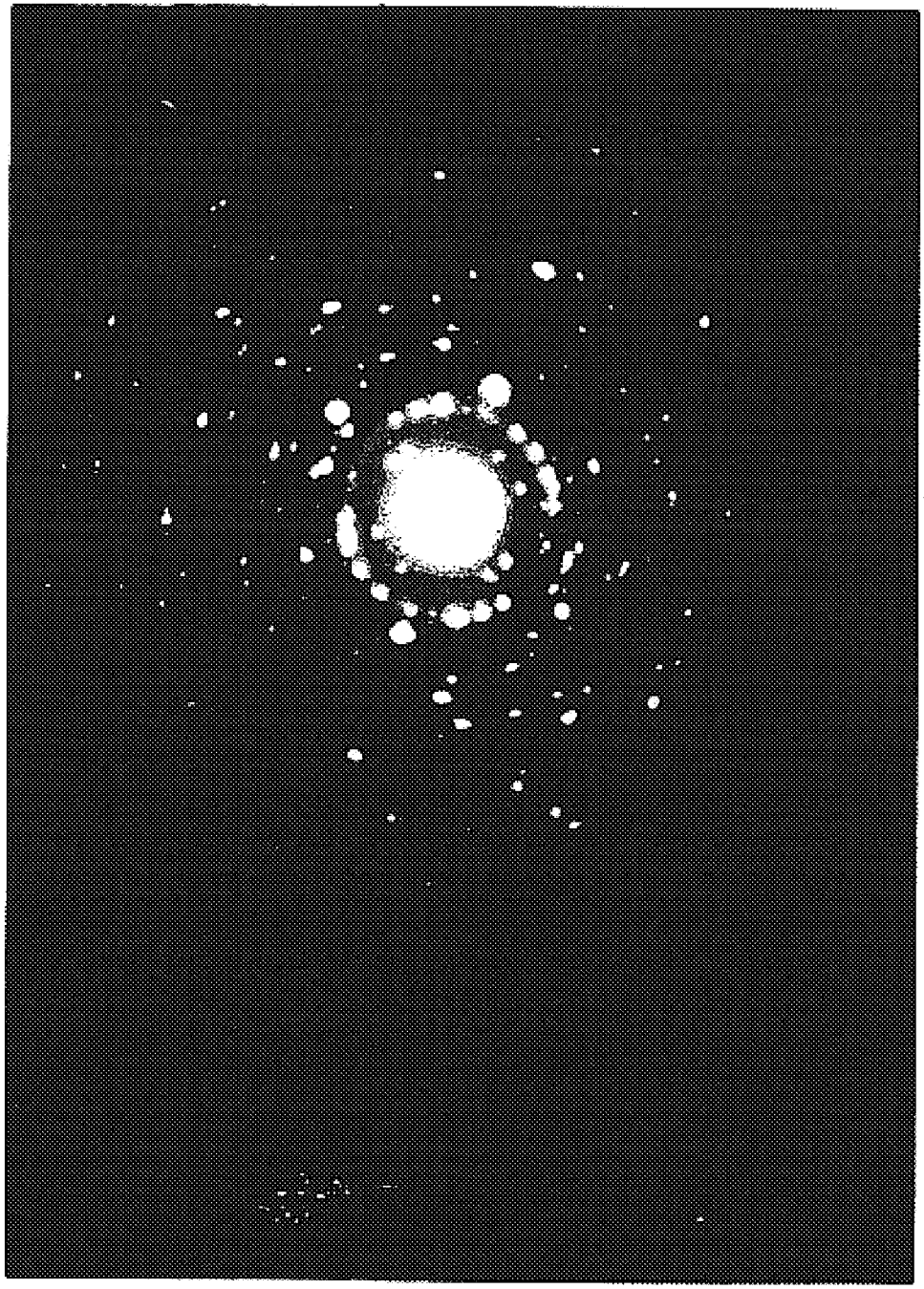
FIG. 12 is a diagram to show an electron beam diffraction pattern obtained under the conditions of the selected-area diffraction in a test on foreign substances in grain boundaries of a piezoelectric thin film, and indicates a pattern of the present embodiment.

Foreign substances were tested at the grain boundaries of the piezoelectric thin film obtained by the present embodiment. This test was performed by electron beam diffraction patterns obtained under the conditions of the selected-area diffraction. The white dots shown in FIG. 11 and FIG. 12 are PZT crystals. The area shown in FIG. 11 and FIG. 12 corresponds to the PZT crystal grain boundaries, and the part enclosed by "Δ" in this area are foreign substances which have a composition different from the PZT crystal composition. FIG. 11 is a pattern of the comparison example, and FIG. 12 is a pattern of the present embodiment. It is clearly shown that the pattern in FIG. 12 has fewer impurities than the pattern in FIG. 11.

FIG. 1 is used again for description. After ending process (b) in FIG. 2, process (c) begins. In this process, the top electrode 16, comprised of platinum with a film thickness of about 0.05~0.2 μm, is formed by a sputtering method on the PZT film 15 formed in process (b).

In this way the piezoelectric thin film component shown in FIG. 1 was obtained. It was confirmed that the obtained PZT film 15 has no cracks, and that the above-mentioned layer type discontinuity caused by lamination does not exist in the cross-section.

Figure 13:
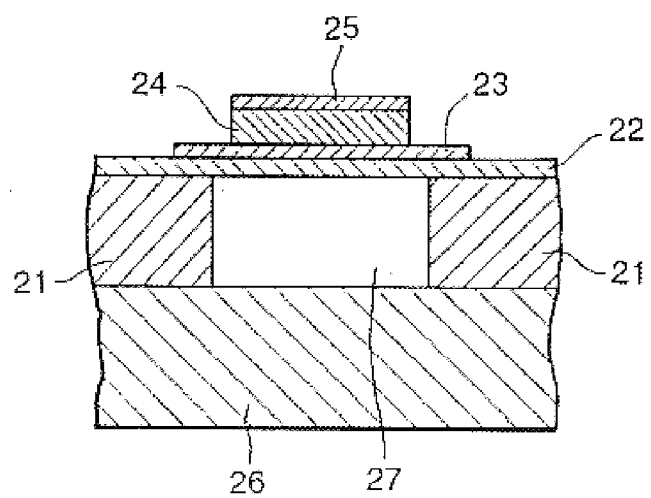
FIG. 13 is a cross-sectional view depicting one ink-filled chamber of an inkjet type recording head where the piezoelectric thin film component in accordance with the present invention is used as an actuator.

FIG. 13 is a cross-sectional view depicting one ink-filled chamber of the inkjet type recording head where the piezoelectric thin film component in accordance with the present invention is used as an actuator.

The inkjet type recording head in accordance with the embodiment 3 comprises a silicon substrate 21 where the ink-filled chamber 27 is formed, a diaphragm 22 formed on the silicon substrate 21, a bottom electrode formed on the diaphragm 22 at a desired position, a piezoelectric thin film 24 formed on the bottom electrode 23 at a position corresponding to the ink-filled chamber 27, a top electrode 25 formed on the piezoelectric thin film 24 and a second substrate 26 bonded with the bottom face of the silicon substrate 21, as FIG. 13 shows.

In this inkjet type recording head, ink is supplied to the ink-filled chamber 27 via the ink channel, which is not illustrated. If voltage is applied to the piezoelectric film 24 via the bottom electrode 23 and the top electrode 25, the piezoelectric film 24 deforms and applies pressure to the ink-filled chamber 27, which applies pressure to the ink. By this pressure, the ink is ejected from the nozzle, which is not illustrated, and inkjet recording is performed.

Here, this inkjet type recording head uses the above-mentioned piezoelectric thin film component having superb piezoelectric characteristics as an actuator, therefore ink can be ejected at a high pressure. Also the top electrode displays high piezoelectric characteristics when the drive voltage waveform, which has a higher potential than the bottom electrode, is applied.

Although titanium was used in the description as the above-mentioned crystal source, this is not restricted, and any constituent element of the piezoelectric film which can be seed crystals and be alloyed with piezoelectric thin film, can be used in place of titanium. The bottom electrode is platinum in the above description, but iridium, which has the same FCC structure, can exhibit a similar effect.

Also in the above-mentioned MOD process, conditions are the same as the sol-gel method except that the means for creating sol is different from the sol-gel method. In the case of mixing sol in the MOD process, dispersed sol is not hydrolyzed in the sol solution after mixing. This means that the purpose or feature is not to cause a sol-gel reaction more than creating dehydrated poly-condensation or a gel network.

In concrete terms, monoethanol amine, which is an alkanolamine, is selected as a starting material of a sol solution, which functions as the hydrolysis inhibitor of metal alkoxide and metal acetate. By the function of monoethanolamine, metal alkoxide and metal acetate can maintain a uniform dispersion state in the sol solution. Since a gel network, observed in the case of the sol-gel method, is not created, more homogenous crystals than the sol-gel method can be obtained. All processes from sol coating to the baking process to obtain crystals are the same as the sol-gel method. Instead of using the above-mentioned monoethanolamine, diethanolamine, triethanolamine, acetylacetone, and acetic acid can be used as the hydrolysis inhibitors of sol.

As described above, the present invention can implement a piezoelectric thin film component which has low residual strain and is superb in piezoelectric strain characteristics. This piezoelectric thin film component can display excellent displacement when an electric field is applied, therefore an inkjet type recording head comprising this piezoelectric thin film component can increase ink ejection volume.

What is claimed is:

1. A method for manufacturing a piezoelectric thin film component comprising:
    a) depositing seed crystals on a crystal grain boundary of a bottom electrode;
    b) forming a film of a sol composition on the seed crystals, wherein the sol composition includes a high molecular organic compound mixed therein;
    c) heating the film of the sol composition at a temperature between 300° C. and 500° C. to gelatinize the film and to remove the organic compound from the film thereby forming a porous gel thin film comprised of amorphous metal oxides;

d) baking the porous gel thin film at a temperature between 500° C. and 800° C. in a pre-annealing process until the gel thin film is uniformly crystallized and transformed into a crystalline metal oxide film, wherein the pre-annealing process is performed in two stages comprised of a first stage annealing performed at a temperature between 500° C. to 600° C. and a second stage annealing performed at a temperature between 600° C. to 800° C.;

e) repeating steps b, c and d to laminate consecutive layers of a substantially integrated crystalline thin film;

f) performing a final annealing of the substantially integrated film formed in step (e) such that pervoskite crystal growth occurs and a polycrystalline piezoelectric thin film is formed on the bottom electrode; and g) forming a top electrode on the piezoelectric thin film formed in step (f).

2. A method for manufacturing a piezoelectric thin film component comprising:

a) depositing seed crystals on a crystal grain boundary of a bottom electrode;

b) forming a film of a sol composition on the seed crystals, wherein the sol composition includes a high molecular organic compound mixed therein;

c) heating the film of the sol composition at a temperature between 300° C. and 500° C. to gelatinize the film and to remove the organic compound from the film thereby forming a porous gel thin film comprised of amorphous metal oxides;

d) baking the porous gel thin film at a temperature between 500° C. and 800° C. in a pre-annealing process until the gel thin film is uniformly crystallized and transformed into a crystalline metal oxide film;

e) repeating steps b, c and d to laminate consecutive layers of a substantially integrated crystalline thin film;

f) performing a final annealing of the substantially integrated film formed in step (e) such that pervoskite crystal growth occurs and a polycrystalline piezoelectric thin film is formed on the bottom electrode, wherein the final annealing is performed in two stages comprised of a first stage annealing performed at a temperature between 600° C. to 800° C. and a second stage annealing performed at a temperature between 800° C. to 1000° C.; and g) forming a top electrode on the piezoelectric thin film formed in step (f).

* * * * *